United States Patent [19]

Kress

[11] 4,446,222

[45] May 1, 1984

[54] METHOD OF PREPARING PRINTING SURFACE FORMED OF POLYMERIC RESIN CONTAINING POLYAMIDE AND DICARBOXYLIC ACID DIESTER

[75] Inventor: David R. Kress, Rochester, N.Y.

[73] Assignee: Matrix Unlimited, Inc., Rochester, N.Y.

[21] Appl. No.: 390,175

[22] Filed: Jun. 21, 1982

Related U.S. Application Data

[62] Division of Ser. No. 249,070, Mar. 30, 1981, Pat. No. 4,345,022, which is a division of Ser. No. 93,622, Nov. 13, 1979, Pat. No. 4,269,930.

[51] Int. Cl.³ .............................................. G03C 5/00
[52] U.S. Cl. .................................. 430/307; 430/283; 430/285; 430/271

[58] Field of Search ............... 430/270, 281, 288, 307, 430/283, 906, 908, 271, 910, 285; 204/159.19

[56] References Cited

U.S. PATENT DOCUMENTS

| 3,516,828 | 6/1970 | Floss et al. | 430/306 |
| 3,764,324 | 10/1973 | Reyes | 430/306 |
| 3,770,435 | 11/1973 | Volker et al. | 430/307 |
| 4,144,073 | 3/1979 | Bronstert et al. | 430/288 |

Primary Examiner—Jack P. Brammer
Attorney, Agent, or Firm—Stonebraker, Shepard & Stephens

[57] ABSTRACT

A photopolymerizable composition of matter useful for photopolymeric printing surfaces is disclosed. Printing surfaces prepared from the composition are strong and wear well, resist solvents and abrasives, and are suitable for intaglio or gravure printing.

8 Claims, 1 Drawing Figure

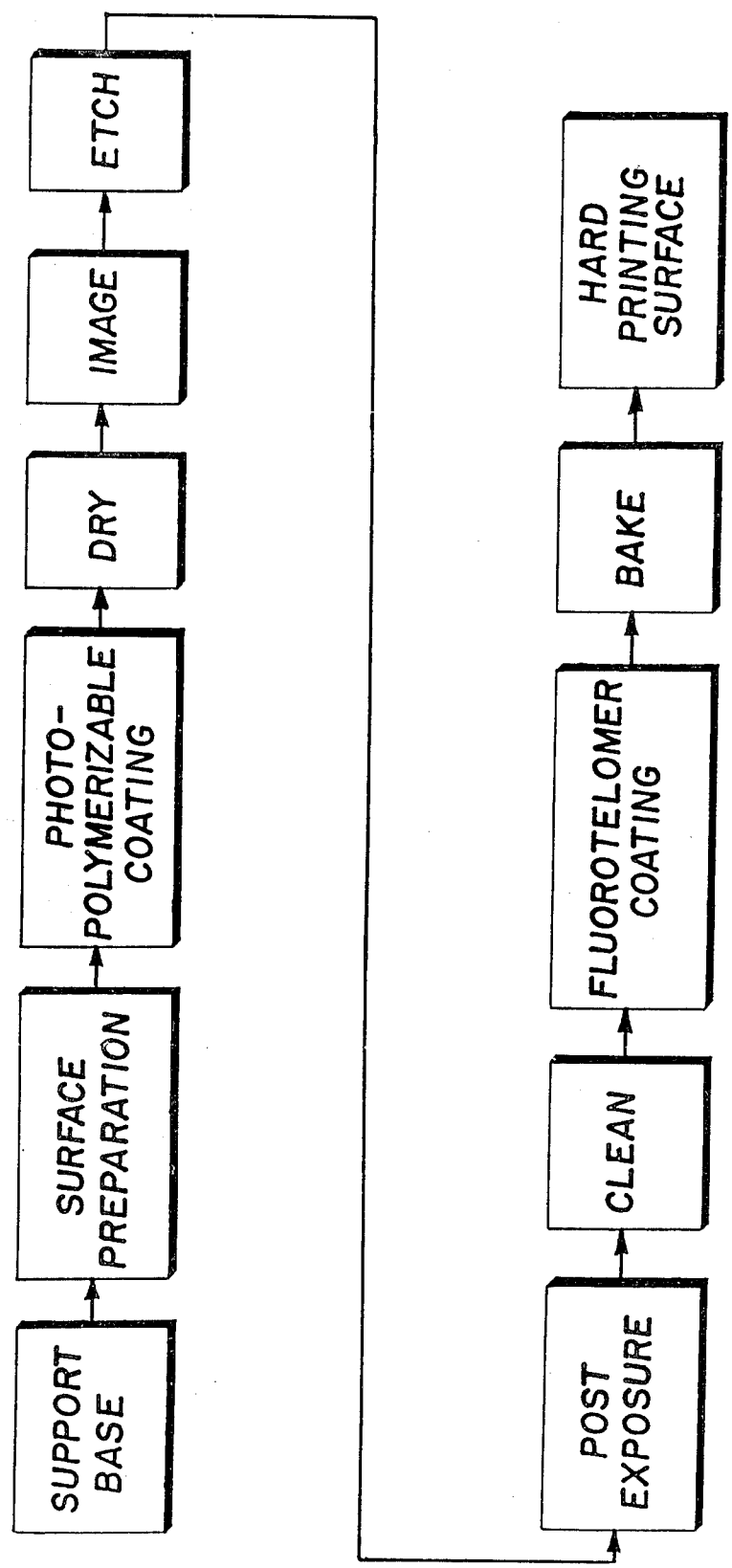

METHOD OF PREPARING PRINTING SURFACE FORMED OF POLYMERIC RESIN CONTAINING POLYAMIDE AND DICARBOXYLIC ACID DIESTER

This is a division of parent allowed application Ser. No. 249,070, filed Mar. 30, 1981, now U.S. Pat. No. 4,345,022, which parent application is a division of grandparent application Ser. No. 093,622, filed Nov. 13, 1979, now U.S. Pat. No. 4,269,930, issued May 26, 1981.

BACKGROUND OF THE INVENTION

Photopolymeric printing plates are widely used in the printing industry where they have many advantages but suffer from the well recognized disadvantages of being relatively soft and susceptible to attack by many organic solvents. These disadvantages make conventional photopolymeric printing surfaces unsuited for many types of printing involving mechanical stress, surface wear, or solvents or abrasive materials in inks. This particularly includes intaglio or gravure printing that involves doctor blades wearing against the print surface, strong solvents in the inks, high speeds, and long runs. Gravure has remained beyond the capacity of photopolymers and has required more expensive metal surfaces.

I have discovered a photopolymerizable composition of matter that produces a harder, tougher, and more wear resistant photopolymer than previously available. The composition is useful in producing harder printing surfaces suitable for types of printing that photopolymers could not previously withstand, particularly intaglio or gravure printing.

SUMMARY OF THE INVENTION

The photopolymerizable composition of matter of my invention comprises a mixture of:
  a. from about 70–95%, by weight, of an alcohol-soluble linear polyamide;
  b. from about 0.5–15%, by weight, of a low molecular weight dicarboxylic acid diester; and
  c. an effective amount of at least one photosensitizer and at least one polymerization inhibitor.

In preparing a photopolymeric printing surface according to my invention, I coat a backing or base with a mixture of alcohol and my photopolymerizable composition. The alcohol serves as a solvent and carrier allowing the mixture to be coated evenly; and then the alcohol evaporates, leaving a dry and uniform coating of the photopolymerizable composition.

Actinic light passing through a photographic image photopolymerizes a portion of the coating; and an etching or washing fluid removes the unexposed portion of the coating, leaving an etched printing surface. The etched surface may, optionally, be coated with a thin layer of a fluorotelomer material to provide a smooth, low friction surface finish with enhanced wear resistance and ink release properties. The etched polymer, whether coated or uncoated, may also, optionally, be baked to increase its hardness.

Printing surfaces prepared according to my invention are tougher, harder, and more durable than photopolymeric materials currently available to the printing industry. This, together with their resistance to most organic solvents, makes them useful in printing applications beyond the capacity of previous photopolymers.

Other uses and advantages of my invention may occur as knowledge about it spreads.

DRAWING

The Drawing is a schematic diagram of preferred steps in my process for preparing a photopolymeric printing surface from my photopolymerizable composition.

DETAILED DESCRIPTION

The photopolymerizable composition of matter of my invention comprises, in its simplest form, a mixture of:
  a. from about 70–95%, by weight, of an alcohol-soluble linear polyamide;
  b. from about 0.5–15%, by weight, of a low molecular weight dicarboxylic acid diester; and
  c. an effective amount of at least one photosensitizer and at least one polymerization inhibitor.

The polyamide component of this composition may be any of the polyamides that are conventionally used in photopolymeric compositions. These include copolyamides that are soluble in common solvents or mixtures of solvents, such as lower aliphatic alcohols or mixtures of these alcohols with water, ketones, or aromatic compounds. Typically, copolyamides are prepared by polycondensation or activated anionic polymerization of two or more lactams having from five to thirteen ring members, or by polycondensation of the appropriate dicarboxylic acids and diamines, as is well known to those skilled in the art. Particularly suitable linear polyamides are those described in U.S. Pat. Nos. 3,512,971; 3,516,828; and 4,144,073, the disclosures of which are hereby incorporated by reference.

By the term "low molecular weight dicarboxylic acid diester" is meant saturated and unsaturated dicarboxylic acid diesters having up to eight carbon atoms in the acid backbone and up to about four carbon atoms in the alcohol moiety appended at the ester linkage. Preferred diesters include diethyl malonate, diethyl fumarate, diethyl sebacate, dipropyl adipate, and diethyl maleate. There is some evidence, although presently inconclusive, that the resistance of the photopolymer of my invention to certain strong organic solvents, such as methyl ethyl ketone, decreases with increasing molecular weight of the acid portion of the diester component. Hence, the most preferred diester components of my photopolymerizable composition are those having short acid backbones, i.e., diethyl malonate, diethyl fumarate, and diethyl maleate.

The photosensitizers suitable for use in my composition are those compounds that decompose to radicals upon exposure to light or irradiation and initiate polymerization. Such compounds are well known to those skilled in the art and include acyloins and their derivatives, such as benzoin, benzoin alkyl ethers, alpha-methylolbenzoin and its ethers, alpha-methylbenzoin, diketones and their derivatives, monoketals, and substituted and unsubstituted quinones, such as anthraquinone. Many other photosensitizers are available and probably workable, including inorganic materials such as potassium dichromate, which I have used successfully.

It is possible to use a single photosensitizer or mixtures of photosensitizers in my composition. Generally, the photosensitizer is included in the photopolymerizable composition in amounts ranging from 0.01–5% by weight. Of course, the precise amount required will depend upon the particular polyamide in the composition, as well as the parameters of the photopolymerization process. Those skilled in the art will have little difficulty in selecting a particular photosensitizer or mixture of photosensitizers for a specific application.

Likewise, the polymerization inhibitors included in my composition are any of the conventional inhibitors for preventing thermal polymerization, such as methylene blue, hydroquinone, p-methoxyphenol, etc. These compounds are incorporated into my composition individually or as mixtures, in amounts ranging from 0.01-2% by weight. Again, the precise amount will depend upon numerous factors and, in particular, the nature of the process used to photopolymerize the composition.

Other components not necessary to obtain the goal of my invention may be included in my photopolymerizable composition. These include, for example, unsaturated monomers, such as acrylamides, as well as dyes and pigments. Any added materials should withstand solvents and temperatures to be encountered later in the life of the polymer.

To prepare the composition of my invention, the various components in the appropriate quantities are dissolved in a lower aliphatic alcohol, preferably n-propanol, to form a mixture having a consistency suitable for spraying or otherwise coating my composition on a flat or cylindrical base.

Alternately, the composition can be prepared by stripping unexposed photopolymeric material from commercial printing plates containing alcohol-soluble linear polyamides, photosensitizers, polymerization inhibitors, and a low molecular weight dicarboxylic acid or anhydride, in general accordance with U.S. Pat. Nos. 3,512,971 or 3,516,828. This is done with a stripping fluid formed as a mixture of water and a lower aliphatic alcohol, e.g., ethanol, as generally known. Additional photosensitizers and inhibitors may be added to the stripped photopolymeric composition to adjust its exposure sensitivity. The resulting mixture of stripping fluid and stripped photopolymeric composition is then heated to cause phase separation.

While not intending to be bound by theory, I believe that this heating of the mixture causes the dicarboxylic acid or anhydride to convert to the corresponding dicarboxylic acid diester. The aqueous phase containing water, alcohol, and low molecular weight monomers is discarded; and the organic phase, which contains the photopolymerizable composition, is dissolved in alcohol for coating on a base plate or cylinder.

Further details of the preparation of photopolymerizable compositions according to my invention appear in the examples following this detailed description.

My photopolymerizable composition can be used to form many types of photopolymeric printing surfaces. These include both relief surfaces having an ink-bearing level raised from surrounding areas and intaglio or gravure surfaces having ink-bearing regions formed as shallow recesses. A doctor blade generally wipes excess ink from intaglio surfaces, and both intaglio and relief surfaces can be used either in direct or offset printing. Variations on these processes are extensive and generally known; and there is reason to believe that my photopolymeric composition will succeed at most of them, especially since it is hard, tough, and wears well against a doctor blade.

The photoresponsiveness of my composition is similar to commercially available photopolymer printing plates made according to U.S. Pat. Nos. 3,512,971 and 3,516,828. It resolves fine detail and images and etches cleanly and accurately so that it can be used for many types of printing. The processes for imaging and etching my material are generally similar to known processes for imaging and etching prior art photopolymeric plates. These processes expand somewhat to apply my material to more uses, however, because its increased hardness and its ability to withstand extensive running against a doctor blade make it useful for both flat and cylindrical gravure printing, either direct or offset. The gravure image area can be divided into a regular array of shallow cells in a generally known way or can be formed of individually shaped fine lines in the manner of a handmade steel engraving plate. For this, a conveniently large drawing can be photographically reduced and imaged on my material for printing precious documents with either flat or rotary surfaces. So my material succeeds in the same printing applications as previous photopolymers and wears longer because of its greater strength and hardness, and these characteristics also give it a wider range of uses that previous photopolymers could not attain.

My photopolymerizable composition is coated on a support or base material that is suitable for the printing circumstances. This includes both flat plates and cylinders formed of a wide variety of materials, including metals and plastics. The coating can be applied in many ways as known in the coating arts. The general requirements are that the support or base functions satisfactorily for the printing involved, that the polymer coating securely bonds to the base, and that the bond is not attacked or weakened by solvents or temperatures to be encountered later. These limitations allow many variations, however; some of which are described below.

My composition photopolymerizes on exposure to actinic radiation, which in this case is ultraviolet light as already developed for exposing and imaging photopolymers and photoresist materials. Coating and other operations that occur before exposure are accomplished in yellow light.

In making a photopolymeric printing element according to my invention, I first prepare the surface of a support base to receive a coating of my polymerizable composition. Although this can vary with different materials and configurations, my experience has been with metal surfaces that I polish and then cover with a thin and even primer coating. A suitable primer must resist baking temperatures and alcohols and other solvents that will later be encountered, and it generally must provide a secure and durable bond between the metal base and the polymer coating. I have succeeded with both an industrial primer enamel and an acrylic primer, and there is reason to believe that many other primers will work.

I spray the primer coating evenly over the metal surface using either an air or airless spray gun and then bake the primer coating dry. A primer can also be applied with other spraying and coating techniques with the goal being a smooth and even coating having no entrapped gas to cause imperfections. The primer coating is preferably very thin and no thicker than necessary to achieve a uniform coat.

After the primer coating has dried, I sand or grind it with a very fine grit to remove surface gloss and leave a mat finish. It may also be possible to prepare a satisfactory mat surface for receiving my polymerizable coating directly on a metal surface by using a "pickling"

composition, sandblasting, or other metal surfacing techniques. There is reason to believe that my polymerizable composition can be coated on existing gravure cylinders having metal surfaces of copper, brass, nickel, and other metals, either by using a suitable primer coating or a surface treatment. Also, plastic surfaces may be prepared in different ways to receive my polymerizable coating. The alternatives allow my polymer to be used on a wider variety of bases than are practical for metallic surfaced gravure cylinders.

I next coat my photopolymerizable composition onto the prepared surface of the base by dissolving my composition in a lower aliphatic alcohol, preferably n-propanol to make it sufficiently fluid. The alcohol acts as a diluent or carrier enabling the composition to be coated evenly over the entire surface of the base. This can be done by using any of several known coating techniques, and I have succeeded by spraying the mixture onto the base surface. The preferred thickness of the coating depends on the type of printing to be done, and I have coated my photopolymerizable composition on gravure cylinders at a rate of about 1 milliliter per square inch. Letter press printing would require a much thicker coating, which could be built up in even layers to any desired thickness.

After coating my photopolymerizable composition evenly on the base, I heat the coating to a temperature of about 150° F. to evaporate the alcohol, leaving only the photopolymerizable composition as a dry coating. The surface of the coating should be glossy smooth; and to achieve this, I polish the dry surface after heating. Coating techniques that directly produce an adequately smooth surface could eliminate the polishing step and would require only drying the coating without necessarily heating.

My photopolymerizable coating is then ready for imaging and etching by the same general methods already in use in the art. Negative or positive images placed in close contact with the smooth surface of my coating allow actinic ultraviolet light to polymerize portions of the surface in the pattern of the image used. Then a washing or etching fluid formed as a mixture of water and a lower aliphatic alcohol, such as ethanol, removes unpolymerized material leaving polymerized material forming a printing surface in the desired image.

A thin residue of dilute polymerizable material remains from the etching process. To remove this, the etched surface is postexposed to actinic ultraviolet light for an exposure time that is ordinarily about one-fifth the length of the imaging exposure for further polymerizing and hardening the polymer surface without polymerizing the dilute residue. Then the surface can be cleaned with an alcohol rinse; and I prefer n-propanol and gentle wiping, leaving a glossy and residue-free surface.

At this point, my etched photopolymer resists solvents and is harder than known photopolymers so that it can be used for printing. However, it also can be made much harder by baking, which I prefer for improving its printing capacity. My etched photopolymer can be baked directly at high temperatures around 500° F., which would destroy conventional photopolymeric plates, but which makes my polymer hard, tough, and durable. The baking does not damage the surface finish of my polymer or diminish its accuracy or detail; and it hardens and toughens it enough to withstand the rigors of doctor blades, strong solvents, heavy stress, and long wear.

Before baking, I prefer coating intaglio type photopolymeric surfaces with a thin layer of a fluorotelomer that provides a smooth surface finish with a low friction for wearing well against the doctor blade. A fluorotelomer material that I have found to be particularly effective is marketed by DuPont under the brand name, Vydax 550, as a dispersion of a white, waxy, short-chain telomer of a tetrafluoroethylene in a trichlorotrifluoroethane solvent. It provides a low coefficient of friction and high lubricity on the printing surface and affords excellent release or antistick properties.

My preferred baking step, either with or without a fluorotelomer coating, can be done directly in a conventional oven at temperatures of from 350° to 550° F. and preferably at 450° to 500° F. Higher temperatures generally produce harder surfaces and increased brittleness, and lower temperatures produce less hard surfaces that are more resilient. For gravure printing, I prefer harder surfaces baked at around 500° F.; but lower temperatures leaving a printing surface more resilient might work better in cooperation with some types of doctor blades.

Printing surfaces made according to my invention are tough, hard, durable, highly accurate, and versatile so that they are useful where previous photopolymers have failed. This includes flat and rotary gravure and the printing of precious documents such as checks, travelers checks, stock certificates, etc. made from a host of individual lines previously requiring handmade engravings. Hardened intaglio surfaces made by my invention can also be used as dyes for making molded polymeric relief plates. Gravure surfaces made by my invention have been highly successful in printing precious documents and may even succeed in printing money.

The strength and hardness of my polymeric material suggests other possible uses outside the printing arts where hard, durable plastics are required. My composition can be polymerized by heat as well as by actinic light, suggesting that photosensitizers could be eliminated and my composition could be thermally polymerized to form useful articles.

Although evidence is incomplete and I do not wish to be bound by theory, I believe that the hard and strong polymer of my invention results from the reaction of the linear polyamide component of my composition with the diester component to form a cross linked reaction product that is strong, hard, and tough. The proportion of the diester component that is able to react with the linear polyamide component and form a strong, hard, and tough polymer is generally within 0.5 to 15% by weight of the composition. It is possible that the cross linking produced by less than 0.5% of the diester component will also increase the strength and toughness of the polymer, and it is likely that more than 15% of the diester component will form an uneconomical excess of diester in the composition.

The following examples illustrate practice of preferred embodiments of my invention and are presented to illustrate and explain and not to limit the scope of my claimed invention.

EXAMPLE 1

Preparation of Photopolymeric Gravure Cylinder Using Materials from Commercial Photopolymeric Plates I have salvaged unpolymerized photopolymeric material stripped from commercial plates sold by BASF Wyandotte Corporation under the brand name, Nyloprint, and used it to make several gravure cylinders coated with my composition. The salvaged material was mixed with a stripping fluid formed as a mixture of water and ethanol as recommended by the plate manufacturer. So far as could be determined, these plates were made according to the disclosures of U.S. Pat. Nos. 3,512,971 and 3,516,828 and contained an alcohol-soluble copolyamide (prepared by polycondensation of hexamethylene diammonium adipate, 4,4'-diaminodicyclohexylmethane salt of adipic acid and epsilon-caprolactam), benzoin methyl ether, p-xylylene-bis-acrylamide, hexamethylene-bis-acrylamide, triethylene glycol diacrylate, butanediol monoacrylate, maleic anhydride, and hydroquinone.

To adjust the responsiveness of this material to ultraviolet light, I added one-half gram methylene blue and one-half gram potassium dichromate to seven gallons of the stripped mixture. I heated the resulting mixture to a temperature between 180°–190° F. where a phase separation occurs, the exact phase separation temperature depending upon the particular portion of components. Also, the phase separation temperature slightly exceeds the temperature (believed to be 167°–176° F.) that converts the maleic anhydride to diethyl maleate so that this conversion occurs by the time phase separation occurs.

I then discarded the aqueous phase and recovered the organic phase that I dissolved in an equal volume of n-propanol. I stored the resulting photopolymerizable composition in n-propanol in a dark container to inhibit premature photopolymerization.

I mounted a standard aluminum gravure cylinder on a lathe where I polished its surface and spray coated it with an acrylic primer made by the Borden Company under the Krylon brand name. I baked this coating dry and hard at 150° F. and then sanded the primer surface lightly with an extremely fine grit to remove surface gloss. I have also prepared steel gravure cylinders in a similar way by using an industrial primer baked at 350° F. as recommended by the manufacturer and sanded to remove surface gloss.

I then spray coated my polymerizable composition in n-propanol evenly over the primer coating by rotating the cylinder on the lathe and slowly and evenly moving a spray gun along the length of the cylinder. This and other operations before exposure of the coating were done in yellow light to avoid premature polymerization.

I coated the polymeric coating on the cylinder at approximately 1 milliliter per square inch, which is thick enough for gravure printing purposes. I then heated the coated cylinder to about 150° F. to dry the coating, which I then polished to a glossy smooth surface finish.

I then used conventional technology to secure a photographic element tightly around the cylinder and expose the photopolymerizable coating to ultraviolet light as the cylinder rotated on the lathe. I used two 40 watt ultraviolet lights to provide the actinic light during a 15 to 20 minute exposure.

I then removed the photographic element from the cylinder and used a conventional washing or etching fluid comprising a mixture of water and ethanol that I sprayed on the cylinder to remove the unexposed and unpolymerized material. I postexposed the etched cylinder to ultraviolet light for about three minutes to complete the photopolymerization of the unetched material. Then I cleaned etching residue from the cylinder with a rinse of n-propanol followed by lightly wiping the cylinder with a clean cloth.

I next spray-coated the photopolymer surface with a thin layer of a fluorotelomer material marketed by DuPont under the brand name, Vydax. Then I baked the Vydax coated cylinder in an oven heated to a temperature of about 450°–500° F. to harden and toughen the etched photopolymer printing surface.

Subsequent testing indicated that the cylinder withstood strong organic solvents, such as methyl ethyl ketone, and made satisfactory gravure printed copies of the image from the photographic element. The cylinder also survived endurance tests both running in ink against a doctor blade and actual runs on a printing press.

EXAMPLE 2

Preparation of Photopolymerizable Composition Using Different Diesters

Five photopolymerizable compositions were prepared by mixing an alcohol-soluble linear polyamide benzoin methyl ether and a dicarboxylic acid diester in the following proportions:

| Sample | Polyamide | Benzoin Methyl Ether | Diester |
|---|---|---|---|
| A | 0.50009 gm | 0.00954 gm | diethyl malonate 20 μl |
| B | 0.50096 gm | 0.01025 gm | diethyl maleate 20 μl |
| C | 0.60088 gm | 0.00984 gm | diethyl fumarate 20 μl |
| D | 0.60099 gm | 0.01001 gm | diethyl sebacate 20 μl |
| E | 0.59969 gm | 0.01008 gm | dipropyl adipate 20 μl |

The mixtures were dissolved in 1.4 milliliter methanol, poured on a flat plate, dried in a dark room, covered with a negative, and exposed to ultraviolet light. The unexposed portions of the plate were removed by etching with a mixture of water and ethanol. The etched photopolymer coating was resistant to methyl ethyl ketone. Samples D and E exhibited some peeling from the plate.

I claim:

1. A process for preparing a hard printing surface comprising:
   a. coating a base with a mixture of alcohol and a photopolymerizable composition of matter comprising:
   (1) from about 70–95% by weight of an alcohol-soluble linear polyamide;
   (2) from about 0.5–15% by weight of a low molecular weight dicarboxylic acid diester selected from the group consisting of saturated and unsaturated dicarboxylic acid diesters having up to eight carbon atoms in the acid backbone and up to about four carbon atoms in the alcohol moiety appended at the ester linkage; and (3) an effective amount of at least one photosensitizer and at least one polymerization inhibitor;

b. drying the coating;

c. exposing the coating to actinic light through a photographic element to selectively photopolymerize the coating; and d. etching the unexposed portions of the coating.

2. The process of claim 1 wherein subsequent to step d, the etched coating is heated at a temperature between about 350°–550° F. to further harden the coating.

3. The process of claim 2 wherein said temperature is between about 450°–500° F.

4. The process of claim 2 wherein before said etched coating is heated, it is coated with a thin layer of a fluorotelomer material.

5. The process of claim 1 wherein prior to said coating step a, said base is polished and coated with a primer coating.

6. The process of claim 5 wherein said primer coating is roughened by sanding or grinding prior to said coating of said mixture containing said photopolymerizable composition of matter.

7. The process of claim 1 wherein said mixture of said photopolymerizable composition of matter is coated on said base in quantities of about 1 milliliter per square inch.

8. The process of claim 1 wherein said drying step b is accomplished by heating the coated base to about 150° F.

* * * * *